United States Patent
Williams et al.

(10) Patent No.: US 7,264,456 B2
(45) Date of Patent: Sep. 4, 2007

(54) LEADFRAME AND METHOD FOR REDUCING MOLD COMPOUND ADHESION PROBLEMS

(75) Inventors: Vernon M. Williams, Meridian, ID (US); Michael D. Gifford, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 890 days.

(21) Appl. No.: 09/974,958

(22) Filed: Oct. 10, 2001

(65) Prior Publication Data

US 2003/0067061 A1    Apr. 10, 2003

(51) Int. Cl.
B29C 45/14    (2006.01)
H01L 21/56    (2006.01)

(52) U.S. Cl. ............ 425/116; 257/666; 425/129.1
(58) Field of Classification Search ......... 425/116, 425/129.1; 257/666
See application file for complete search history.

(56) References Cited

U.S. PATENT DOCUMENTS

| | | | |
|---|---|---|---|
| 3,659,821 A | 5/1972 | Sakamoto et al. ............ 249/84 |
| 3,911,075 A | 10/1975 | Boesch et al. ............ 264/329 |
| 3,969,461 A | 7/1976 | Boesch et al. ............ 264/163 |
| 4,132,856 A | 1/1979 | Hutchison et al. ......... 174/52.2 |
| 4,504,435 A | 3/1985 | Orcutt ................... 264/272.17 |
| 4,653,993 A | 3/1987 | Boschman .................. 425/116 |
| 4,862,586 A | 9/1989 | Osada ......................... 29/827 |
| 4,984,064 A | 1/1991 | Toshio et al. ............... 257/724 |
| 5,071,612 A | 12/1991 | Obara ........................ 264/161 |
| 5,431,854 A | 7/1995 | Pas ......................... 264/328.5 |
| 5,542,171 A | 8/1996 | Juskey et al. ................. 29/840 |
| 5,635,671 A * | 6/1997 | Freyman et al. ........... 174/52.2 |
| 5,728,599 A * | 3/1998 | Rostoker et al. ............ 505/330 |
| 5,929,511 A * | 7/1999 | Nakazawa et al. .......... 257/666 |
| 5,961,912 A | 10/1999 | Huang et al. ........... 264/272.15 |
| 5,981,873 A * | 11/1999 | Heo .......................... 174/52.2 |
| 6,096,250 A * | 8/2000 | Chen .......................... 264/130 |
| 6,106,259 A | 8/2000 | Lee et al. .................... 425/116 |
| 6,194,777 B1 | 2/2001 | Abbott et al. ............... 257/666 |
| 6,309,916 B1 | 10/2001 | Crowley et al. ............ 438/127 |
| 6,319,450 B1 | 11/2001 | Chua et al. ............. 264/272.17 |
| 6,372,553 B1 * | 4/2002 | Briar .......................... 438/127 |

(Continued)

FOREIGN PATENT DOCUMENTS

JP    64-013749    1/1989

(Continued)

Primary Examiner—Robert B. Davis
(74) Attorney, Agent, or Firm—Dorsey & Whitney LLP

(57) ABSTRACT

An integrated circuit leadframe has a pair of leadframe rails that are specially treated to adhere to injection mold compounds to a lesser or greater degree than portions of the leadframe rails outside of the treated areas. By adhering to mold compounds to a greater degree, mold compound not removed during a deflashing procedure does not flake off to form mold compound debris during a trimming and forming procedure. By adhering to mold compounds to a lesser degree, substantially all of the mold compound is removed during the deflashing procedure so there is no mold compound to flake off to form mold compound debris during the trimming and forming procedure. The leadframe rails may be treated by forming apertures in the rails, by increasing or decreasing the roughness of the leadframe rails, or by coating the leadframe rails with an adhesion promoting or reducing material.

23 Claims, 5 Drawing Sheets

U.S. PATENT DOCUMENTS

| | | | |
|---|---|---|---|
| 6,468,361 B1 | 10/2002 | Cantillep | 134/18 |
| 6,528,000 B2 | 3/2003 | Yoshiike | 264/272.17 |
| 6,580,620 B1 * | 6/2003 | Kim | 361/784 |

FOREIGN PATENT DOCUMENTS

| | | | |
|---|---|---|---|
| JP | 02148816 A | * | 6/1990 |
| JP | 04079357 A | * | 3/1992 |
| JP | 04324668 A | | 11/1992 |
| JP | 08222676 A | | 8/1996 |
| JP | 08264708 A | | 10/1996 |

* cited by examiner

LEADFRAME AND METHOD FOR REDUCING MOLD COMPOUND ADHESION PROBLEMS

TECHNICAL FIELD

This invention related to injection molding of integrated circuit packages, and, more particularly, to devices and methods for reducing problems resulting from mold compound adhering to integrated circuit leadframes.

BACKGROUND OF THE INVENTION

As shown in FIG. 1, integrated circuits are typically encapsulated in a package 10 of a suitable material, such as epoxy, from which conductive leads 12 project. Although the leads 12 are shown in FIG. 1 as being conductors that project laterally and then downwardly, other lead configurations are in common use.

The encapsulation of the integrated circuit is typically performed by placing the integrated circuit in a mold then injecting a mold compound into the mold. A typical integrated circuit injection mold 20 is shown in FIG. 2. The mold 20 includes a rectangular upper mold section 26 and a matching lower mold section 28, each of which have a series of mold cavities 36, 38, respectively, formed in respective adjoining mold surfaces 30, 32. Each of the adjoining pairs of mold cavities 36, 38 generally encapsulate a single integrated circuit, although it is possible to encapsulate several interconnected integrated circuits in a single mold cavity pair. Eight mold cavities 36, 38 are shown in FIG. 2, but a greater or lesser number of mold cavities may be formed in conventional mold sections. The mold cavities 36, 38 are typically rectangular to match the desired shape of the integrated circuit package 10 (FIG. 1), but other shapes are also possible.

In practice, before the integrated circuits are placed in respective pairs of mold cavities 36, 38, they are attached to a leadframe, and the integrated circuit and leadframe are placed between the mold sections 26, 28. A typical leadframe 40 is shown in FIG. 3A. The leadframe 40 includes several leadframe sections 44 corresponding in number to the number of pairs of mold cavities 36, 38, and corresponding in size and shape to the size and shape of the mold cavities 36, 38. A single leadframe section 44 is shown in FIG. 3B. With reference to FIG. 3B, each leadframe section 44 includes a central mounting plate 46 to which an integrated circuit 48 is mounted by suitable means, such as adhesive tape (not shown). Each leadframe section 44 also includes a plurality of inner leads 50 projecting from each side of the central mounting plate 46 to a respective gasket strip 52, and a plurality of outer leads 56 aligned with respective inner leads 50 extending from the gasket strips 52 to an outer strip 58. The outer leads 56 are what eventually form the leads 12 shown in FIG. 1. The leadframe 40 also includes leadframe rails 60, 62 extending along the longitudinal edges of the leadframe 40. As explained in greater detail below, after the package 10 has been formed, the portion of the leadframe 40 extending beyond the outer leads 56 and the leadframe rails 60, 62 are removed. As a result, the only portion of the leadframe 40 extending beyond the package 10 are the outer leads 56 (i.e., 12), as shown in FIG. 1.

The leadframe 40 to which the integrated circuit 48 is attached is placed in the mold 20 between the mold sections 26, 28, with each leadframe section 44 aligned with a respective pair of mold cavities 36, 38. The leadframe 40 is also placed in the mold 20 so that the gasket strips 52 and leadframe rails 60, 62 extend around the cavities 36, 38 in contact with the mold surfaces 30, 32. As a result, the leadframe 40 acts as a gasket to retain material within the cavities 36, 38.

After the leadframe and integrated circuit 48 have been placed in the mold 20, a mold compound is injected into each pair of the cavities 36, 38 through a respective injection inlet 70 (FIG. 2) provided for each pair of mold cavities 36, 38 at one edge thereof. The injection inlets are formed in either or both of the mold sections 26, 28. The injection inlets 70 provide a path for the mold compound, generally an epoxy compound, to be injected into the mold cavities 26, 28. The mold compound attempts to displace air in the mold cavities 36, 38, and this air must therefore be vented from the cavities 36, 38. For this purpose, mold vents 74 are formed in either or both of the mold sections 26, 28 through an edge of each pair of mold cavities 36, 38 opposite the injection inlets 70.

After the mold compound has solidified, the mold sections 26, 28 are separated to allow the leadframe 40 and packages 10 to be removed from the mold 20. As previously explained, the leadframe 40 forms a gasket between the mold sections 26, 28 to prevent the mold compound from leaking out of the mold cavities 36, 38. In practice, however, some of the mold compound leaks past the gasket strip 52 onto the outer leads 56 and the outer rails 58. Some of the mold compound also leaks onto the leadframe rails 60, 62. The undesired mold compound on these exposed portions of the leadframe 40 is known as mold compound "flash."

Throughout the manufacturing process, the leadframe 40 may be exposed to various contaminants, such as the mold compound flash, as described above. These contaminants, including mold compound flash, are removed from the leadframe 40 in a deflashing procedure after the leadframe 40 and packages 10 have been removed from the mold 20. The deflashing procedure also cleans the leadframe 40 so the leadframe 40 can be properly electroplated, as described below.

Several varieties of deflashing procedures may be used. One conventional deflashing procedure uses an electrolytic deflash machine (not shown) that consists of two main components, an electrolytic deflash section and a high pressure rinse section. The electrolytic deflash section includes a deflash cell in the form of a box that is lined with iridium oxide coated titanium plates. The plates become anodes when they are connected to a positive voltage. An electrolyte is pumped into the deflash cell from a mixing tank to immerse the plates. A stainless steel conveyor passes through the deflash cell just over the electrolyte. The conveyor becomes the cathode when it is connected to the negative voltage through copper brushes. The leadframes 40 are suspended vertically from the conveyor so that they are immersed in the electrolyte. An electrical current is passed through the electrolyte to ionize some of the water in the deflash solution, thereby creating positively charged and negatively charged ions. The positively charged ions (H+) migrate to the negatively charged leadframes 40. When the hydrogen ions reach the surface of the leadframes 40, they gain an electron and join together to create hydrogen gas bubbles. The rapid evolution of hydrogen bubbles on the surface of the leadframes 40 causes sufficient agitation to loosen the surface contamination. After the rapid evolution of hydrogen bubbles loosens the surface contamination, the leadframes 40 are transported to the high pressure rinse section where they are carried through a high pressure water rinse. The high pressure rinse blasts away the loosened surface contamination from the leadframes 40.

Although the electrolytic deflash procedure is described in some detail herein, other conventional deflash procedures may be used. For example, the leadframe 40 may be sprayed with abrasive particles in a process similar to sandblasting. The mold compound flash may alternatively be removed from the leadframe 40 by high intensity laser radiation or some other means.

After the deflashing procedure, the leadframe 40 is typically electroplated with a lead/tin alloy. The alloy prevents oxidation of the leadframe 40 and promotes the solderability of the leadframe 40. The leadframe 40 may be fabricated from copper, for example, and oxidation would increase its contact resistance if the leadframe 40 was not electroplated.

Regardless of the deflashing procedure that is used, the deflashing procedure often fails to adequately remove the flash from the leadframe 40. Instead, although some of the flash is removed, an unacceptable amount commonly adheres to the leadframe 40, particularly on the leadframe rails 60, 62, which are the exposed surfaces of the leadframe 40 having the largest area. This flash remaining on the leadframe 40 can prevent the leadframe 40 from being properly electroplated. Also, the remaining flash can cause a number of problems in subsequent productions stages, as explained below.

After undergoing the deflashing and electroplating procedures, the leadframe 40 undergoes a trimming and forming procedure. This procedure is generally accomplished using a trimming and forming tool that cuts the outer rails 58 and leadframe rails 60, 62 from the leadframe 40, thereby leaving only the outer leads 56 as exposed portions of the leadframe. In the forming procedure, the outer leads 56 are bent to the configuration of leads 12 shown in FIG. 1.

The final manufacturing procedure is a visual inspection of the package 10 and leads 12. This procedure is generally performed using a vision system, such as a video camera coupled to a computer that has been programmed with software to examine the package and leads 12 for such parameters as lead spacing and bending form.

As mentioned previously, an unacceptable amount of mold compound flash commonly remains on the leadframe 40 after the deflashing procedure. This flash can flake off from the leadframe 40 during the trimming and forming procedure, resulting in debris that can interfere with the operation of the trimming and forming tool used to perform the trimming and forming procedure. It is therefore necessary to frequently clean the flash debris from the trimming and forming tool, which requires manpower and takes the trimming and forming tool out of service for the period of time needed to complete the cleaning operation. The flash debris can also increase the maintenance required for the trimming and forming tool and shorten its useful life. A significant amount of flash debris can also remain on the package 10 and leads 12 after the trimming and forming procedure, thereby interfering with the operation of the vision system that inspects the package 10 and leads 12. For example, flakes of flash debris finding their way onto a lens of the vision system may obscure the view of the package 10 and leads 12. Flash debris flakes may also cause false inspection results that may cause unwarranted rejection of an integrated circuit. For example, a flake of flash debris on a lead 12 may cause the vision system to interpret adjacent leads to be too closely spaced to each other.

There is therefore a need for a device and method that substantially prevents mold compound flash debris form interfering with subsequent processing steps.

SUMMARY OF THE INVENTION

A leadframe is adapted for use with an injection mold having a plurality of mold cavities into which a mold compound is injected. The leadframe includes a pair of leadframe rails extending along opposite sides of the leadframe. The mold compound adherence properties of the leadframe rails are adjusted so that the mold compound adheres to the rails either relatively well or relatively poorly. By adhering relatively well to the leadframe rails, the mold compound flash does not flake off from the rails during the trimming procedure. As a result, the mold compound flash is removed with the removal of the trimming of the leadframe rails from the package. By adhering relatively poorly to the leadframe rails, substantially all of the mold compound flash is removed from the leadframe rails during the deflashing procedure. As a result, there is virtually no mold compound flash on the leadframe by the time the trimming and forming procedure is performed. As a result, no flash debris is created during the trimming and forming procedure. The mold compound adherence properties may be adjusted by various means, such as altering the surface properties or materials of the leadframe rails or by creating apertures in the leadframe rails.

DETAILED DESCRIPTION OF THE INVENTION

Figure 3A:
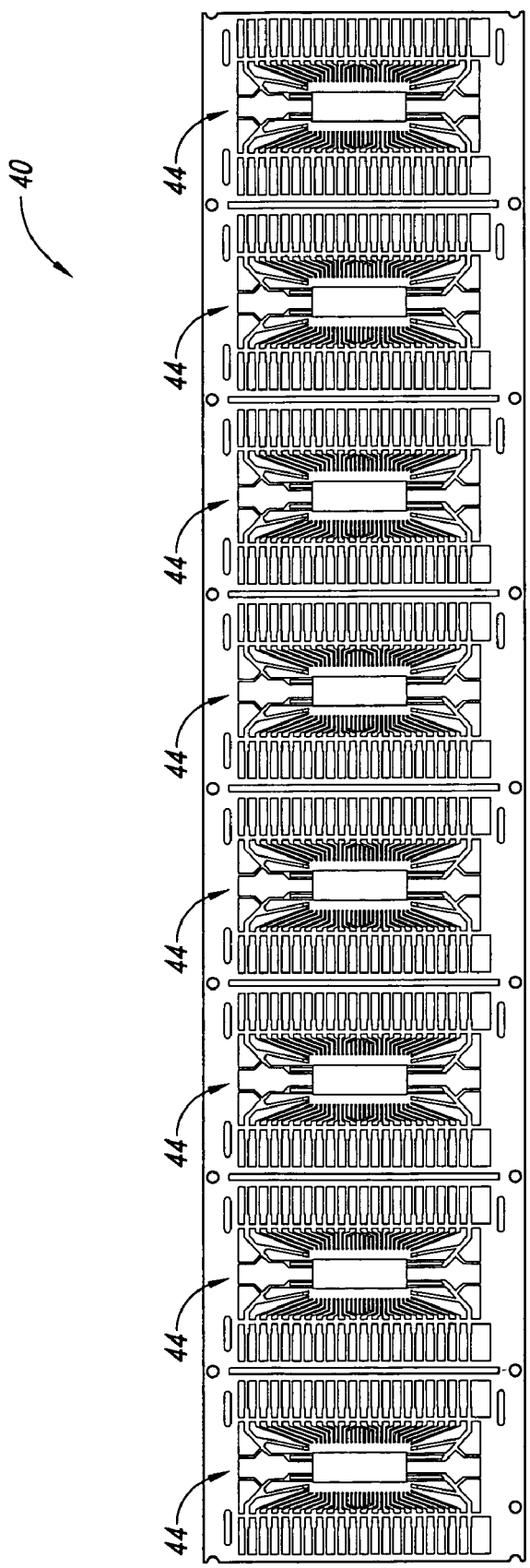
FIGS. 3A and 3B are top plan views of a conventional lead frame used in the injection mold of FIG. 2 to mold integrated circuit packages of the type shown in FIG. 1.
Figure 3B:
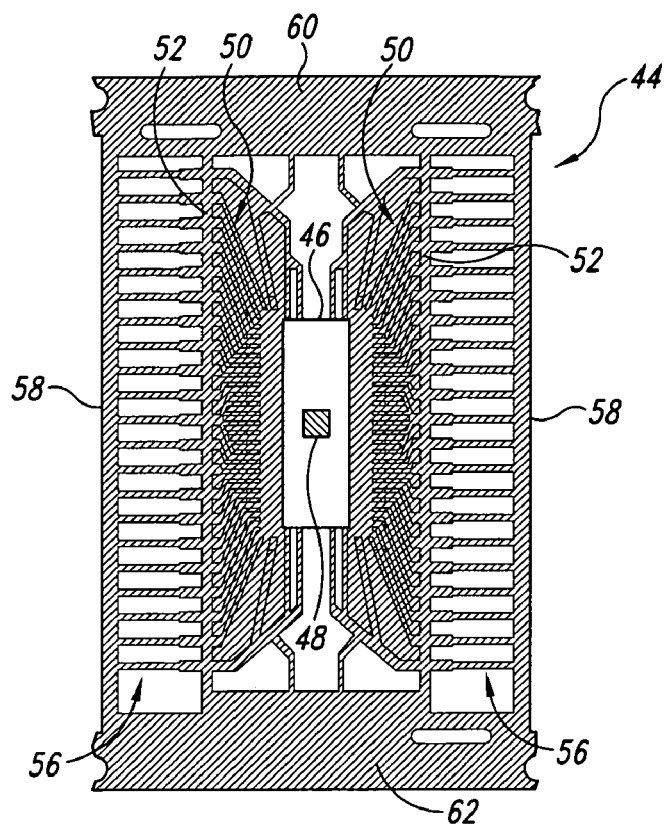
Figure 4:
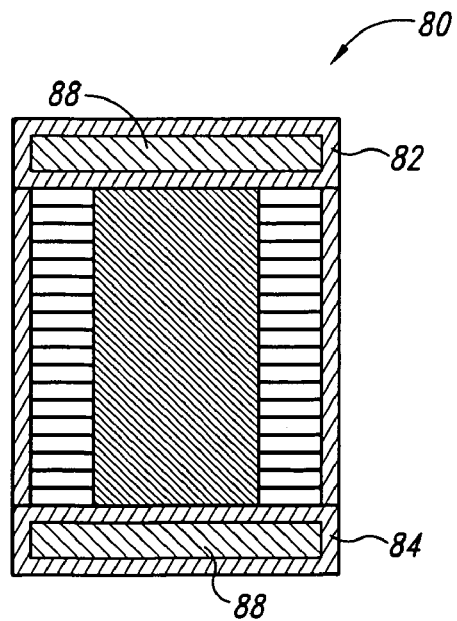
FIG. 4 is an isometric view of a leadframe section according to one embodiment of the invention that facilitates the prevention of mold compound flash debris.

One embodiment of a leadframe 80 that facilitates the prevention of mold compound flash debris is shown in FIG. 4. Many of the features of the leadframe 80 are identical to those of the leadframe 40 shown in FIG. 3. Therefore, in the interest of brevity, these features have been provided with the same reference numerals, and an explanation of the structure and function of these features will not be repeated.

The effectiveness of the leadframe 80 is based on the discovery that the leadframe rails 60, 62 (FIG. 3) found on conventional leadframes, like the leadframe 40 shown in FIG. 3, cause mold compound to bond to the rails 60, 62 too well to be adequately removed by conventional deflashing procedures but not well enough to substantially remain on the leadframe rails 60, 62 during the trimming and cutting procedures. Based on this discovery, mold compound flash debris can be substantially prevented by altering the mold compound adherence properties of the leadframe rails 60, 62. More specifically, the mold compound adherence properties of the leadframe rails 60, 62 may be adjusted so that the mold compound better adheres to the rails 60, 62. By adhering relatively well to the leadframe rails 60, 62, the mold compound flash does not flake off from the rails during the trimming and forming procedure. As a result, the mold compound flash is removed with the trimming of the leadframe rails 60, 62 from the package 10. Also, since the mold compound flash adheres well to the leadframe rails 60, 62 and is removed with the leadframe rails 60, 62, it may be possible to entirely dispense with the deflashing step.

Paradoxically, mold compound flash debris can also be substantially prevented by adjusting the mold compound adherence properties of the leadframe rails 60, 62 so that the mold compound adheres to the rails 60, 62 relatively poorly. By adhering relatively poorly to the leadframe rails 60, 62, substantially all of the mold compound flash is removed from the leadframe rails 60, 62 during the deflashing procedure. As a result, there is virtually no mold compound flash on the leadframe 40 by the time the trimming and forming procedure is performed. Thus, by adjusting the mold compound adherence properties of the leadframe rails 60, 62 in either direction, substantially no flash debris is created during the trimming and forming procedure.

The leadframe 80 shown in FIG. 4 differs from the conventional leadframe 40 of FIG. 3 by having leadframe rails 82, 84 that have formed therein or thereon respective adherence treated areas 88. The adherence treated areas 88 are specifically adapted to cause the mold compound to adhere well to the rails 82, 84 in the adherence treated areas 88. This relatively strong attraction between the mold compound and the adherence treated areas 88 causes any mold compound deposited on the rails 82, 84 during the molding procedure to remain on the rails 82, 84 during the trimming an forming procedure. As a result, no mold compound flash debris is formed, as previously explained.

Figure 5:
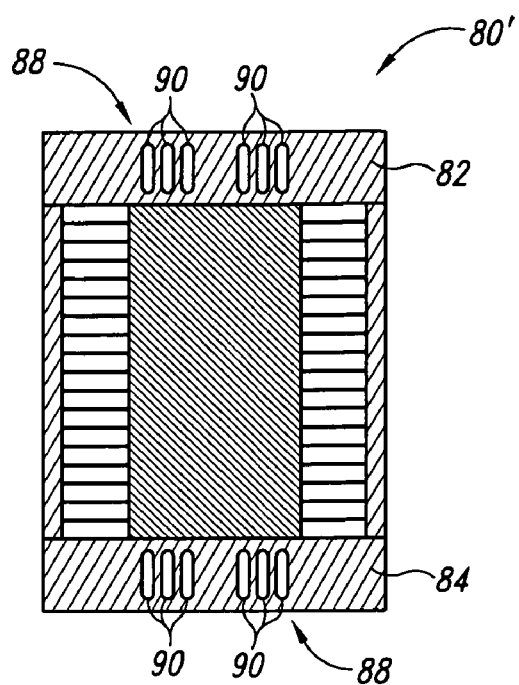
FIG. 5 is an isometric view of one embodiment of the leadframe section of FIG. 4 according to the present invention.

In one embodiment 80' of the leadframe 80 shown in FIG. 5, the adherence treated areas 88 comprises sets of apertures 90 formed in the leadframe rails 82, 84. The apertures 90 may be formed by any means, such as by stamping, etching, laser cutting, or by other means. The apertures 90 are filled with mold compound during the molding process so that the mold compound is held against opposite surfaces of the leadframe rails 82, 84 by mold compound extending through the apertures 90. As a result, the mold compound is more securely attached to the leadframe rails 82, 84. Although the apertures 90 are shown in FIG. 5 as being elongated transversely to the longitudinal axes of the rails 82, 84, the apertures 90 may have other shapes or orientations. Further, although the apertures 90 are shown in FIG. 5 as being arranged in two groups each containing three apertures 90, different numbers of apertures grouped in any manner may alternatively be used.

Figure 6:
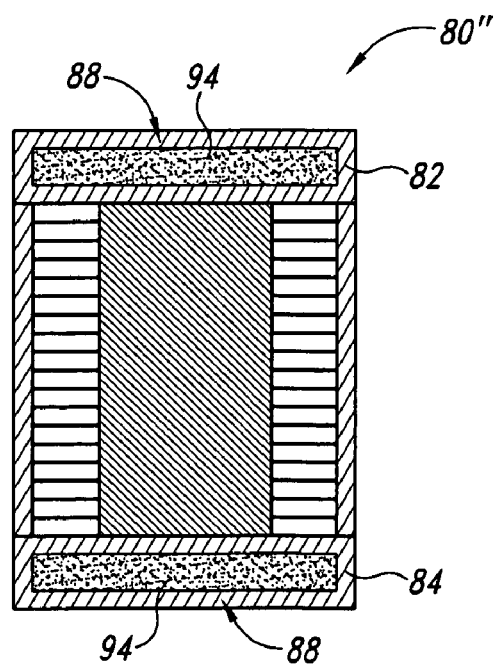
FIG. 6 is an isometric view of another embodiment of the leadframe section of FIG. 4 according to the present invention.

Another embodiment of a leadframe 80" according to the present invention is shown in FIG. 6. The leadframe 80" uses as the adherence treated areas 88 respective surface treatment areas 94 on the leadframe rails 82, 84. Standard surface finish for a leadframe fabricated from copper is typically Ra=0.07 micrometers. In the embodiment shown in FIG. 6, the surface treatment areas 94 have a surface roughness increased by mechanical treatment, such as by stamping, knurling, or engraving, by chemical treatment, or some other means to increase surface area and therefore increase adhesion per unit area. The surface treatment area 94 of increased roughness causes the mold compound to be more securely attached to the leadframe rails 82, 84 so the mold compound remains on the leadframe rails 82, 84 during the trimming procedure. As a result, there is substantially no mold compound flash debris formed during the trimming procedure. The roughened surface treatment areas 94 are preferably formed on both surfaces of each of the leadframe rails 82, 84.

As an alternative to having surface treatment areas 94 that cause the mold compound to be more securely attached to the leadframe rails 82, 84, the surface treatment areas 94 may causes the mold compound to be less securely attached to the leadframe rails 82, 84. As a result, substantially all of the mold compound is removed from the leadframe rails 82, 84 during the deflashing procedure so no flash debris can be formed during the trimming and forming procedures. The surface treatment areas 94 may be made to adhere less securely to the mold compound by, for example, reducing the surface roughness by some method, such as by mechanical or chemical polishing of the leadframe rails 82, 84 in the surface treatment areas 94. As a result, the surface treatment areas 94 are substantially smoother than the remainder of the leadframe rails. The surface treatment areas 94 that adhere less securely to the mold compound are preferably formed on both surfaces of each of the leadframe rails 82, 84

Figure 7:
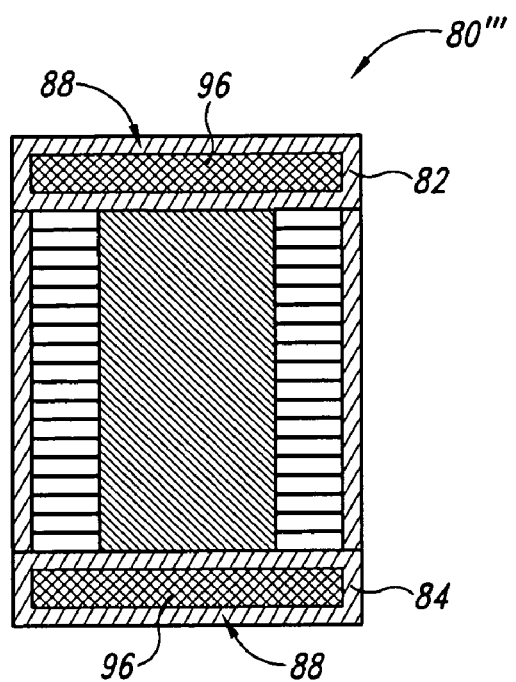
FIG. 7 is an isometric view of still another embodiment of the leadframe section of FIG. 4 according to the present invention.

Still another embodiment of a leadframe 80''' according to the present invention is shown in FIG. 7. The leadframe 80''' uses as the mold compound adherence treated areas 88 respective surface treatment areas 96 of the leadframe rails 82, 84 formed from a different material from the remainder of the rails 82, 84. The surface treatment areas 96 may be formed by any means, such as by coating respective areas of the rails 82, 84 with a suitable material, bonding or otherwise attaching respective panels of a suitable material to areas of the rails 82, 84, creating respective apertures in the rails 82, 84 and inserting a panel of suitable material in each aperture, or by other means. The material used to form the surface treatment areas 96 may be any material to which the mold compound adheres either relatively more securely or relatively less securely. For example, if the remainder of the leadframe 80''' including the leadframe rails 82, 84 are formed from a nickel-based alloy, the material used to form the surface treatment areas 96 may be copper since it has been found that conventional mold compounds adhere better to copper than they do to nickel-based alloys. By way of further example, the surface treatment areas 96 may be areas of the leadframe rails 82, 84 that are coated with a surface lubricant, such as Teflon® or a conventional mold release compound, that causes the mold compound to adhere less securely to the leadframe rails 82, 84. Again, the surface treatment areas 96 are preferably formed on both surfaces of the leadframe rails 82, 84.

It should also be mentioned there is no specific limits to the sizes of the adjusted adherence areas 88, and the sizes or shapes of the adjusted adherence areas 88 may be different from those shown in FIGS. 4-7.

Figure 1:
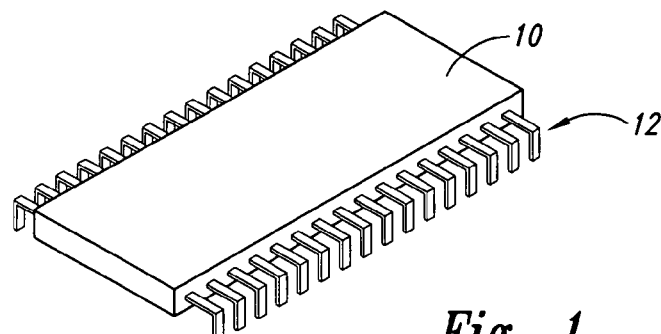
FIG. 1 is an isometric view of a conventional integrated circuit package.
Figure 2:
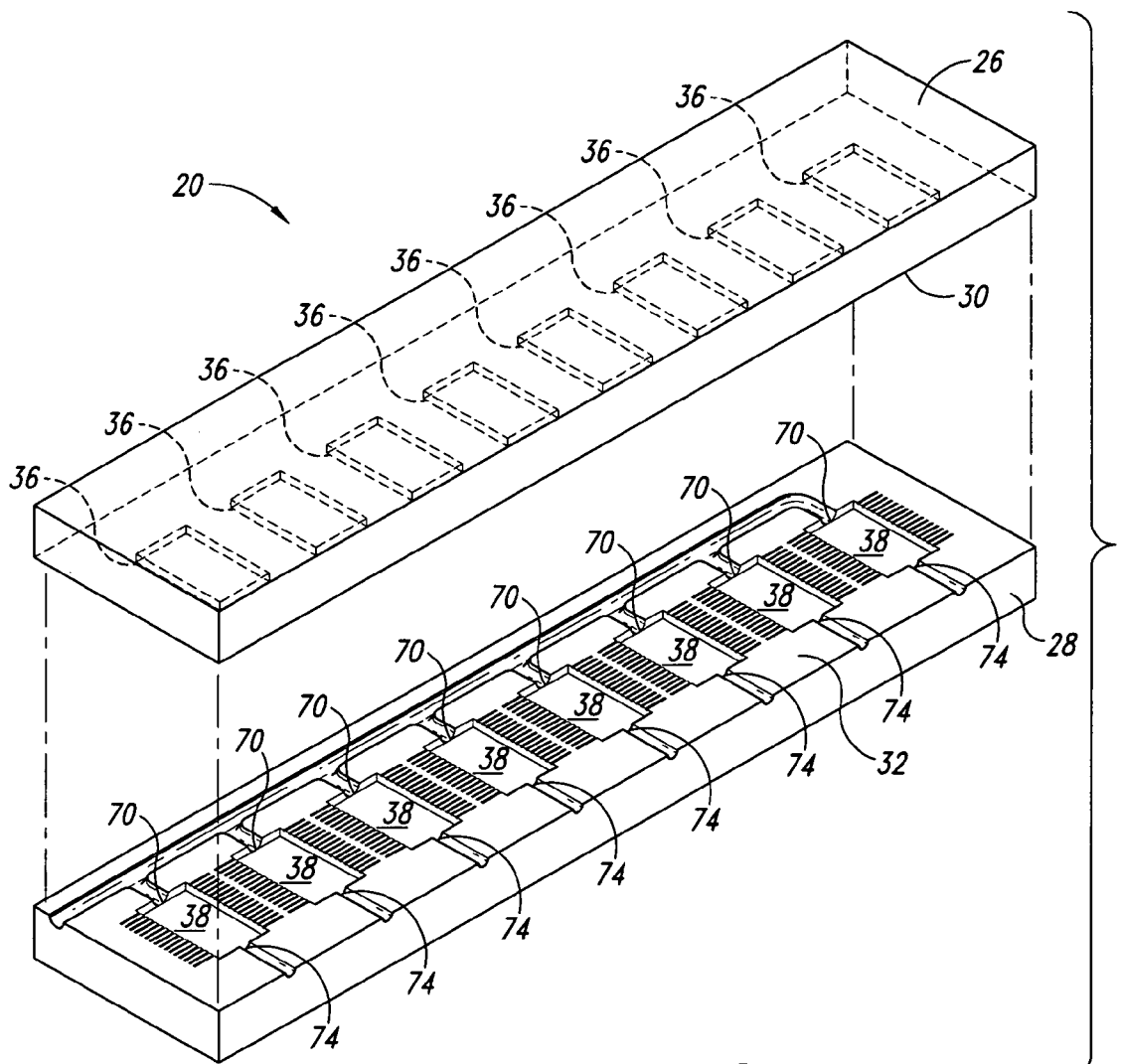
FIG. 2 is an exploded isometric view of an injection mold used to mold integrated circuit packages.
Figure 8:
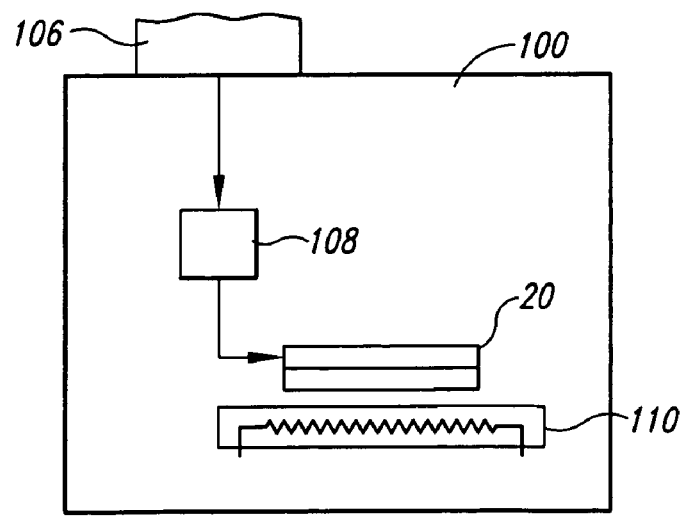
FIG. 8 is an isometric view of an injection molding machine using one of the leadframes embodiments of FIGS. 4-7 according to the present invention.

One embodiment of a molding machine 100 using a mold 20 of the type shown in FIG. 2 and an embodiment of the leadframe 80 shown in FIGS. 4-7 is schematically shown in FIG. 8. The molding machine 100 is of conventional design, and includes a material reservoir 106 containing a supply of mold compound that is to be injected into the mold 20. The molding machine 100 also includes an injection mechanism 108 for forcibly injecting the mold compound from the material reservoir 106 into the mold 20. The molding machine 100 also includes a heating mechanism 110 for heating the mold 20. By using an embodiment of the leadframe 80 specially adapted prevent the formation of mold compound flash debris, the downtime of trimming and forming machines (not shown) subsequently used to process the leadframe is reduced, and the performance of vision systems subsequently used to inspect the resulting integrated circuit is enhanced.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A leadframe adapted to prevent mold compound flash debris, comprising:
   a pair of leadframe rails extending longitudinally along opposite sides of the leadframe and adapted to engage surfaces on upper and lower mold sections to form a gasket; and
   a respective mold compound adherence area formed on each of the leadframe rails, the mold compound adherence area occupying a major portion of a longitudinal dimension of each of the pair of leadframe rails and adapted to abut a surface of the upper or lower mold section, the mold compound adherence area having reduced surface roughness that causes a mold compound to adhere to the mold compound adherence area less securely than portions of the leadframe outside the mold compound adherence area.

2. The leadframe of claim 1 wherein the mold compound adherence areas are formed on opposite surfaces of the respective leadframe rails and each are positioned to abut one of the upper and lower mold sections.

3. The leadframe of claim 1 wherein each of the mold compound adherence areas comprises an polished area of a respective one of the leadframe rails.

4. The leadframe of claim 3 wherein each of the polished areas comprises a mechanically polished area of a respective one of the leadframe rails.

5. The leadframe of claim 3 wherein each of the polished areas of surface roughness comprise a chemically polished area of a respective one of the leadframe rails.

6. The leadframe of claim 3 wherein the polished areas comprise an area of a material on each of the leadframe rails that is the same as a material used to form another portion of the leadframe.

7. The leadframe of claim 1, further comprising:
   a plurality of integrated circuit attachment panels; and
   a plurality of leads extending from each of the integrated circuit attachment panels.

8. An injection mold for molding a package for an integrated circuit, the injection mold comprising:
   a first mold section including a plurality of mold cavities;
   a second mold section including a plurality of mold cavities corresponding in number to the number of cavities included in the first mold section and having a size and a shape corresponding to the size and shape of the mold cavities in the first mold section, at least one of the first and second mold section including a plurality of inlet channels each providing a fluid path into one of the plurality of mold cavities and at least one of the first and second mold sections includes a plurality of vent channels each providing a fluid path away from one of the plurality of mold cavities; and
   a leadframe positioned between the first and second mold sections, the leadframe having a pair of leadframe rails extending along opposite sides of the leadframe across the inlet and vent channels, the leadframe further including a respective mold compound adherence area formed on each of the leadframe rails and extending adjacent the inlet and vent channels, the mold compound adherence area having reduced surface roughness that causes a mold compound to adhere to the mold compound adherence area less securely than portions of the leadframe outside the mold compound adherence area.

9. The injection mold of claim 8 wherein a respective injection inlet adjacent is formed adjacent each of the mold cavities in the second mold section, and a respective mold vent is formed adjacent each of the mold cavities in the second mold section on adjacent an edge of the mold cavity opposite the injection inlet for the mold cavity in the second mold section.

10. The injection mold of claim 8 wherein the mold compound adherence areas are formed on opposite surfaces of the respective leadframe rails.

11. The injection mold of claim 8 wherein each of the mold compound adherence areas comprises a polished area formed on a respective one of the leadframe rails.

12. The injection mold of claim 8 wherein each of the polished areas comprises a mechanically polished area of a respective one of the leadframe rails.

13. The injection mold of claim 8 wherein each of the polished areas comprises a chemically polished area of a respective one of the leadframe rails.

14. The injection mold of claim 11 wherein the polished areas comprise an area of material on each of the leadframe rails that is the same as a material used to form another portion of the leadframe.

15. The injection mold of claim 8, further comprising:
   a plurality of integrated circuit attachment panels; and
   a plurality of leads extending from each of the integrated circuit attachment panels.

16. An injection molding machine for molding integrated circuit packages, comprising:
   a first mold section including a plurality of mold cavities;
   a second mold section including a plurality of mold cavities corresponding in number to the number of cavities included in the first mold section and having a size and a shape corresponding to the size and shape of the mold cavities in the first mold section, at least one of the first and second mold section including a plurality of inlet channels each providing a fluid path into one of the plurality of mold cavities and at least one of the first and second mold sections includes a plurality of vent channels each providing a fluid path away from one of the plurality of mold cavities;
   a material reservoir containing a supply of a mold compound that is to be injected into the mold cavities;
   an injection mechanism in fluid communication with the material reservoir and the injection vents, the injection mechanism forcibly injecting the mold compound from the material reservoir into the mold cavities;
   a heating mechanism for heating the mold sections; and
   a leadframe positioned between the first and second mold sections, the leadframe having a pair of leadframe rails extending along opposite sides of the leadframe across the inlet and vent channels, the leadframe further including a respective mold compound adherence area formed on each of the leadframe rails and extending adjacent the inlet and vent channels, the mold compound adherence area having reduced surface roughness that causes a mold compound to adhere to the mold compound adherence area less securely than portions of the leadframe outside the mold compound adherence area.

17. The injection molding machine of claim 16 wherein a respective injection inlet adjacent is formed adjacent each of the mold cavities in the second mold section, and a respective mold vent is formed adjacent each of the mold cavities in the second mold section on adjacent an edge of the mold cavity opposite the injection inlet for the mold cavity in the second mold section.

18. The injection molding machine of claim 16 wherein the mold compound adherence areas are formed on opposite surfaces of the respective leadframe rails.

19. The injection molding machine of claim 16 wherein each of the mold compound adherence areas comprises a polished area formed on a respective one of the leadframe rails.

20. The injection molding machine of claim 19 wherein each of the polished areas comprises a mechanically polished area of a respective one of the leadframe rails.

21. The injection molding machine of claim 19 wherein each of the polished areas comprises a chemically polished area of a respective one of the leadframe rails.

22. The injection molding machine of claim 19 wherein the polished area comprises an area of a material on each of the leadframe rails that is the same as a material used to form another portion of the leadframe.

23. The injection molding machine of claim 16, further comprising:
   a plurality of integrated circuit attachment panels; and
   a plurality of leads extending from each of the integrated circuit attachment panels.

* * * * *